(12) United States Patent
Chou et al.

(10) Patent No.: US 7,547,969 B2
(45) Date of Patent: Jun. 16, 2009

(54) SEMICONDUCTOR CHIP WITH PASSIVATION LAYER COMPRISING METAL INTERCONNECT AND CONTACT PADS

(75) Inventors: Chiu-Ming Chou, Kao-hsiung (TW); Chien-Kang Chou, Tainan Hsien (TW); Ching-San Lin, Wufong Township, Taichung County (TW); Mou-Shiung Lin, Hsinchu (TW)

(73) Assignee: Megica Corporation, Hsinchu (TW)

( * ) Notice: Subject to any disclaimer, the term of this patent is extended or adjusted under 35 U.S.C. 154(b) by 120 days.

(21) Appl. No.: 11/262,182

(22) Filed: Oct. 28, 2005

(65) Prior Publication Data

US 2006/0091540 A1    May 4, 2006

Related U.S. Application Data

(60) Provisional application No. 60/623,553, filed on Oct. 29, 2004.

(51) Int. Cl.
*H01L 23/48* (2006.01)

(52) U.S. Cl. .................. 257/758; 257/503; 257/E21.59; 257/E23.142

(58) Field of Classification Search ................. 257/737, 257/758, E23.142, 503, E21.59, E23.145
See application file for complete search history.

(56) References Cited

U.S. PATENT DOCUMENTS

| | | | | |
|---|---|---|---|---|
| 4,880,708 A | * | 11/1989 | Sharma et al. | 428/620 |
| 5,742,094 A | * | 4/1998 | Ting | 257/620 |
| 6,383,916 B1 | * | 5/2002 | Lin | 438/637 |
| 6,462,426 B1 | * | 10/2002 | Kelkar et al. | 257/781 |
| 6,617,655 B1 | * | 9/2003 | Estacio et al. | 257/401 |
| 2003/0052409 A1 | * | 3/2003 | Matsuo et al. | 257/737 |

* cited by examiner

*Primary Examiner*—Kimberly D Nguyen
*Assistant Examiner*—Mohammad T Karimy

(57) ABSTRACT

The invention provides a semiconductor chip comprising a semiconductor substrate comprising a MOS device, an interconnecting structure over said semiconductor substrate, and a metal bump over said MOS device, wherein said metal bump has more than 50 percent by weight of gold and has a height of between 8 and 50 microns.

20 Claims, 5 Drawing Sheets

SEMICONDUCTOR CHIP WITH PASSIVATION LAYER COMPRISING METAL INTERCONNECT AND CONTACT PADS

This application claims priority to U.S. provisional application No. 60/623,553, filed on Oct. 29, 2004. This application is related to Ser. No. 12/132,626.

BACKGROUND OF THE PRESENT INVENTION

1. Field of Invention

The invention relates to a semiconductor chip, and particularly to a semiconductor chip with a post-passivation scheme formed over a passivation layer.

2. Description of Related Arts

The Au bumps are used for the TCP (tape carrier packaging) and COG (chip on glass) assembly in the LCD driver ICs. Due to the finer pixel demand and ever-increasing panel size, the required number of I/O layouts is increasing. In the conventional design, referring to FIG. 1, the chip 101 includes a single row of I/O contact pads 102 exposed by openings in a passivation layer. The I/O contact pads 102 are at the periphery of the chip 101. Au bumps 103 are formed on the I/O contact pads 102. There are no semiconductor devices, such MOS devices or transistors, under the I/O contact pads 102.

With the increasing of the number of the I/Os, the size of the Au bumps 103 have to be shrunk to maintain the chip 101 in a small size. Then it becomes technically difficult and economically expensive in connecting the chip 101 to an external circuitry.

Some designers design the contact pads 202 of the chip 201 aligned in two rows, as shown in FIGS. 2 and 3, with the contact pads 202 exposed by openings in a passivation layer 204. There are no semiconductor devices 205, such MOS devices or transistors, under the contact pads 202 and Au bumps 203, neither. Then the chip 201 cannot be maintained in a small size since the underlying semiconductor substrate 206 vacates a peripheral region 207 having no semiconductor devices.

SUMMARY OF THE PRESENT INVENTION

The objective of the invention is to provide multiple metal bumps that are soft and ductile to buffer and absorb the shock energy during assembling the semiconductor chip and an external circuitry or to buffer and absorb the shock energy during a probe or testing card is poked in the metal bumps. Therefore, the invention allows the semiconductor devices under the metal bumps without being damaged if a shock happens to the metal bumps.

Another objective of the invention is to provide an RDL layer that is employed to change the I/O layout from a fine-pitched contact pad exposed by an opening in the passivation layer to a coarse-pitched contact pad formed over the fine-pitched contact pad or a passivation layer. Therefore, the process for forming a metal bump on the RDL layer is easily performed.

Another objective of the invention is to provide a semiconductor chip where a peripheral region of a semiconductor substrate close to the edge thereof may have semiconductor devices formed therein or on. The rate of the semiconductor devices occupying the top surface of the semiconductor substrate is improved and therefore the semiconductor chip can be shrunk.

DETAILED DESCRIPTION OF THE PREFERRED EMBODIMENT

First Embodiment

Figure 1:
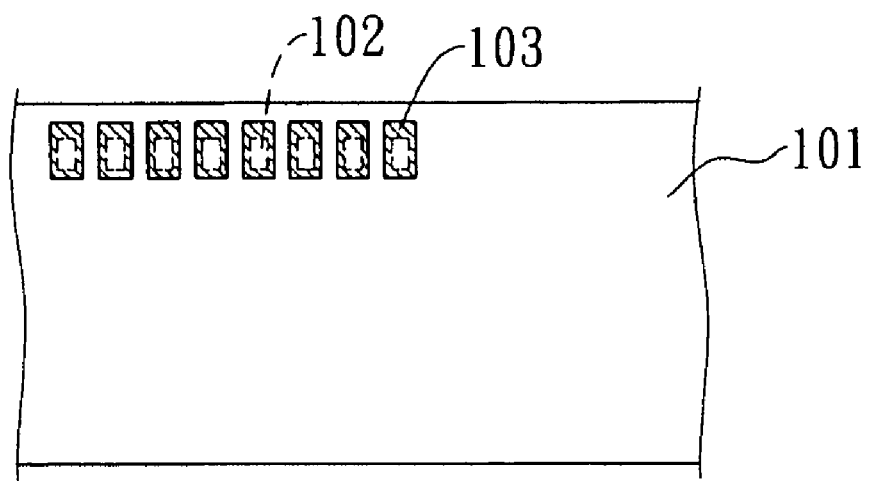
FIG. 1 illustrates a top view of a conventional semiconductor chip.
Figure 2:
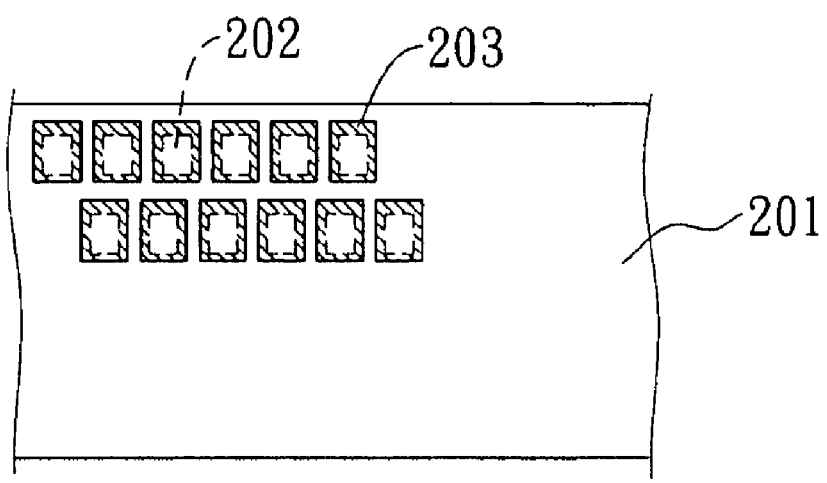
FIG. 2 illustrates a top view of another conventional semiconductor chip.
Figure 3:
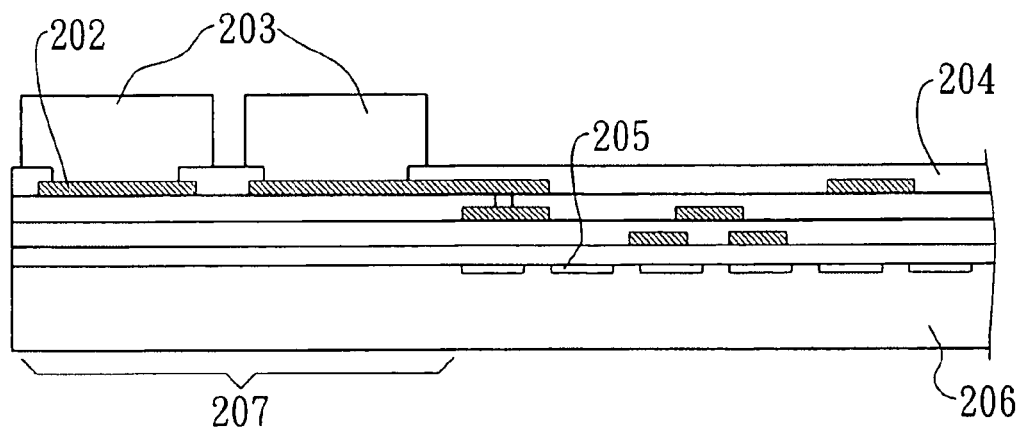
FIG. 3 illustrates a cross-sectional view of FIG. 2.
Figure 4:
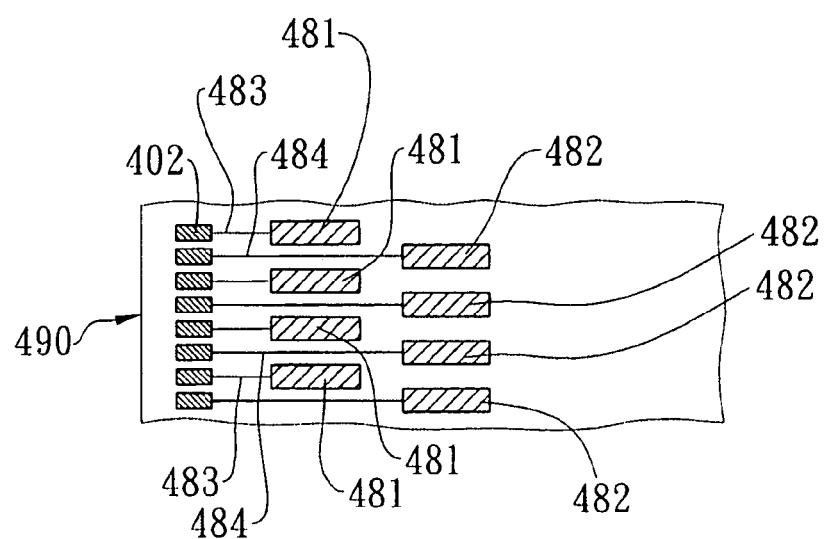
FIG. 4 illustrates a top view of a semiconductor chip according to the invention.
Figure 4A:
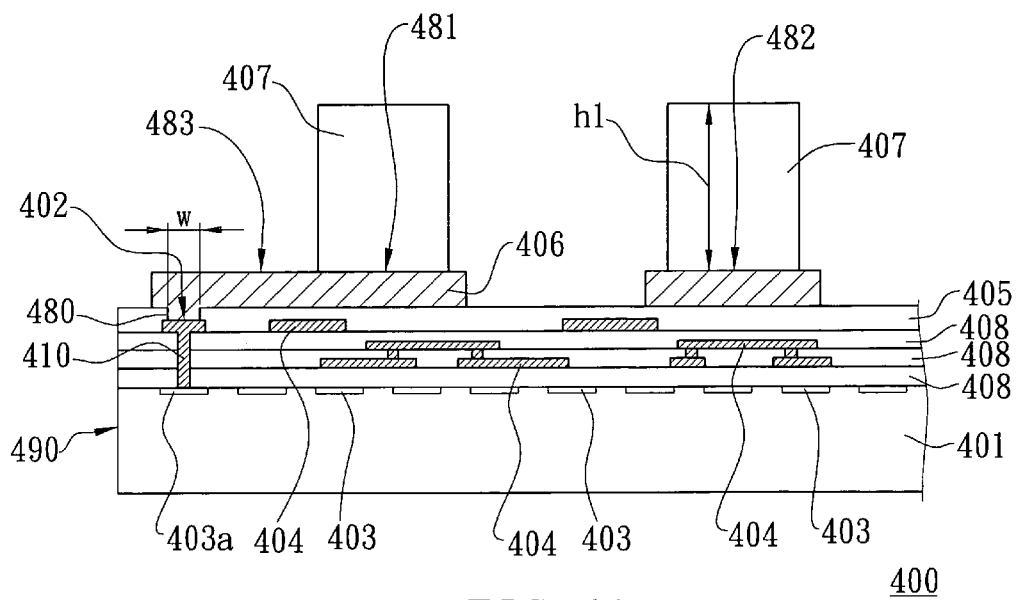
FIG. 4A illustrates a cross-sectional view of FIG. 4.

Referring to FIG. 4A, an embodiment of the invention, it is the cross section of an semiconductor chip 400 including a semiconductor substrate 401, such as silicon substrate, GaAs substrate or SiGe substrate, with multiple semiconductor devices 403, such as CMOS devices, transistors, resistors, capacitors, or inductors, formed therein or on, multiple thin-film dielectric layers 408, such as silicon oxide, over the semiconductor substrate 401, multiple thin-film metal layers 404, formed by a process comprising sputtering an aluminum layer and then patterning the aluminum layer, or by a process comprising electroplating a copper layer in opening in a dielectric layer and on the dielectric layer and then removing the copper layer outside the opening in the dielectric layer using a CMP process, and a passivation layer 405 over the thin-film dielectric layers 408 and thin-film metal layers 404, multiple openings 480 in the passivation layer 405 exposing multiple contact pads 402 provided by the topmost one of the thin-film metal layers 404. The openings 480 have a largest transverse dimension w of between 0.1 and 30 microns, for example. The passivation layer 405 should be thick enough to prevent moisture, impurities, mobile ions or transitional metal elements from moving through the passivation layer 405. The passivation layer 405 is constructed of a silicon oxide compound, a silicon nitride compound, phosphosilicate glass (PSG), a silicon oxynitride compound or a composite formed by depositing the above materials.

In a case, the passivation layer 405 can be formed by first depositing a silicon-oxide layer with a thickness of between 0.2 and 1.0 microns using a PECVD process, then depositing a silicon-nitride layer with a thickness of between 0.2 and 1.0 microns on the silicon-oxide layer using a PECVD process.

In another case, the passivation layer 405 can be formed by first depositing a silicon-oxide layer with a thickness of between 0.2 and 1.0 microns using a PECVD process, then depositing a silicon-oxynitride layer with a thickness of between 0.05 and 0.5 microns on the silicon-oxide layer using a PECVD process, and then depositing a silicon-nitride layer with a thickness of between 0.2 and 1.0 microns on the silicon-oxynitride layer using a PECVD process.

In another case, the passivation layer 405 can be formed by first depositing a silicon-oxynitride layer with a thickness of between 0.05 and 0.5 microns using a PECVD process, then depositing a silicon-oxide layer with a thickness of between 0.2 and 1.0 microns on the silicon-oxynitride layer using a PECVD process, and then depositing a silicon-nitride layer with a thickness of between 0.2 and 1.0 microns on the silicon-oxide layer using a PECVD process.

In another case, the passivation layer 405 can be formed by first depositing a silicon-oxide layer with a thickness of between 0.2 and 1.0 microns using a PECVD process, then depositing a silicon-oxide layer with a thickness of between 0.5 and 3.0 microns on the PECVD silicon-oxide layer using a spin-coating process, then depositing a silicon-oxide layer with a thickness of between 0.2 and 1.0 microns on the spin-coated silicon-oxide layer using a PECVD process, and then depositing a silicon-nitride layer with a thickness of between 0.2 and 1.0 microns on the PECVD silicon-oxide layer using a PECVD process.

In another case, the passivation layer 405 can be formed by first depositing a silicon-oxide layer with a thickness of between 0.5 and 3.0 microns using a HDP-CVD process, and then depositing a silicon-nitride layer with a thickness of between 0.2 and 1.0 microns on the silicon-oxide layer using a PECVD process.

In another case, the passivation layer 405 can be formed by first depositing a USG layer with a thickness of between 0.2 and 3 microns, then depositing a layer of TEOS, BPSG or PSG with a thickness of between 0.5 and 3 microns on the USG layer, and then depositing a silicon-nitride layer with a thickness of between 0.2 and 1.0 microns on the layer of TEOS, BPSG or PSG using a PECVD process.

In another case, the passivation layer 405 can be formed by optionally first depositing a first silicon-oxynitride layer with a thickness of between 0.05 and 0.5 microns on the silicon-oxide layer using a PECVD process, then depositing a silicon-oxide layer with a thickness of between 0.2 and 1.0 microns optionally on the first silicon-oxynitride layer using a PECVD process, then optionally depositing a second silicon-oxynitride layer with a thickness of between 0.05 and 0.5 microns on the silicon-oxide layer using a PECVD process, then depositing a silicon-nitride layer with a thickness of between 0.2 and 1.0 microns on the second silicon-oxynitride layer or on the silicon-oxide layer using a PECVD process, then optionally depositing a third silicon-oxynitride layer with a thickness of between 0.05 and 0.5 microns on the silicon-nitride layer using a PECVD process, and then depositing a silicon-oxide layer with a thickness of between 0.2 and 1.0 microns on the third silicon-oxynitride layer or on the silicon-nitride layer using a PECVD process.

In another case, the passivation layer 405 can be formed by first depositing a first silicon-oxide layer with a thickness of between 0.2 and 1.0 microns using a PECVD process, then depositing a second silicon-oxide layer with a thickness of between 0.5 and 3.0 microns on the first silicon-oxide layer using a spin-coating process, then depositing a third silicon-oxide layer with a thickness of between 0.2 and 1.0 microns on the second silicon-oxide layer using a PECVD process, then depositing a silicon-nitride layer with a thickness of between 0.2 and 1.0 microns on the third silicon-oxide layer using a PECVD process, and then depositing a fourth silicon-oxide layer with a thickness of between 0.2 and 1.0 microns on the silicon-nitride layer using a PECVD process.

In another case, the passivation layer 405 can be formed by first depositing a silicon-oxide layer with a thickness of between 0.5 and 3.0 microns using a HDP-CVD process, then depositing a silicon-nitride layer with a thickness of between 0.2 and 1.0 microns on the silicon-oxide layer using a PECVD process, and then depositing another silicon-oxide layer with a thickness of between 0.5 and 3.0 microns on the silicon-nitride layer using a HDP-CVD process.

Referring to FIG. 4A, a patterned metal layer 406 working as a redistribution layer (RDL) is deposited on the passivation layer 405 and connected to the contact pads 402 through the openings 480 in the passivation layer 405. The redistribution layer 406 includes multiple contact pads 481 and 482 used to have metal bumps 407 formed thereon. The contact pads 481 and 482 have positions different from those of the contact pads 402 exposed by the openings 480 in the passivation layer 405 from a top view, as shown in FIG. 4. FIG. 4 is a top view of FIGS. 4A-4B. The contact pads 481 and 482 are placed close to the edge 490 of the semiconductor chip 400. The contact pads 481 are aligned in an external line, while the contact pads 482 are aligned in an internal line. Multiple traces 484 of the patterned metal layer 406 connecting the contact pads 402 exposed by the openings 480 in the passivation layer 405 to the contact pads 482 aligned in the internal line pass through the gap between the neighboring contact pads 481 aligned in the external line. Multiple traces 483 of the patterned metal layer 406 connect the contact pads 402 exposed by the openings 480 in the passivation layer 405 to the contact pads 481 aligned in the internal line.

Referring to FIG. 4A, the metal bumps 407 are formed over the semiconductor devices 403 and thin-film metal layers 404. The metal bumps 407 can be connected to electrical contact pads on a glass substrate, flexible substrate, TAB (tape automated bonding) carrier or printed circuit board. The metal bumps 407 are formed with more than 50 percent by weight of gold, for example, and preferably with more than 90 percent by weight of gold. The metal bumps 407 have a height h1 of between 8 and 50 microns and, preferably, between 10 and 30 microns. The contact pads 402 are formed over an ESD (electrostatic discharge) circuit 403a and connected to the ESD circuit 403a through a metal plug 410. The metal plug 410 has a bottom end joined to a contact of the ESD circuit 403a and a top end joined to the bottom of the contact pads 402.

Figure 4B:
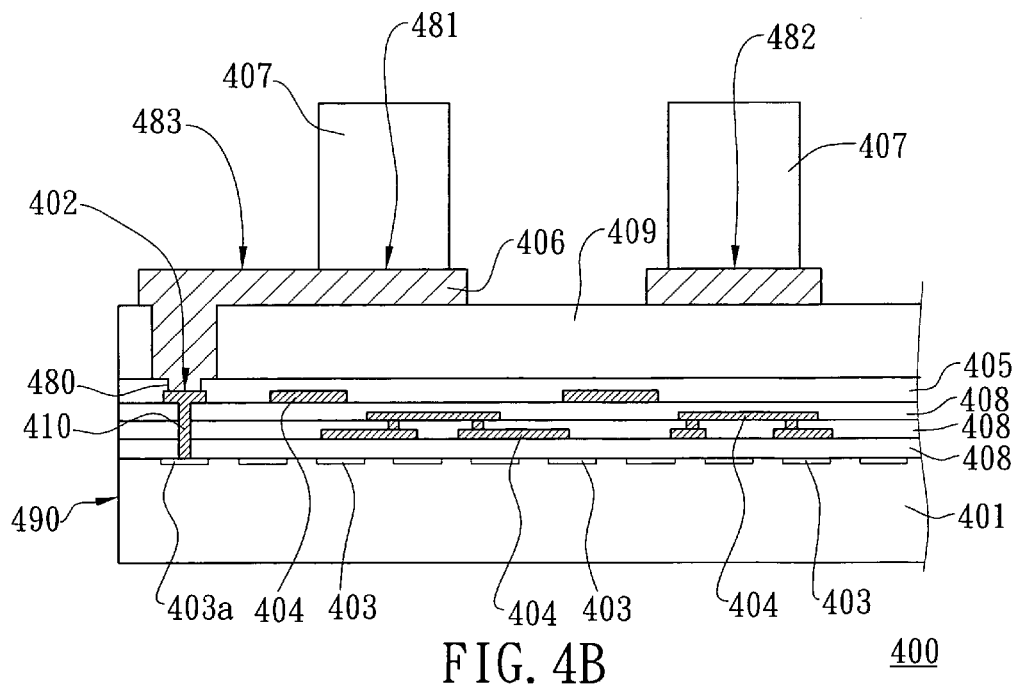
FIG. 4B illustrates an cross-sectional view of an alternative semiconductor chip according to the invention.

Referring to FIG. 4B, another embodiment of the invention, it is almost similar to the detail in FIG. 4A except there is a polymer layer 409 formed on the passivation layer 405 and under the patterned metal layer 406. The polymer layer 409 may be polyimide, benzocyclobutene (BCB), silicone, Teflon, paralene or rubber. Alternatively, the polymer layer 409 may be a porous structure. The polymer layer 409 may have a thickness t1 of between 1 and 30 microns, and, preferably, between 3 and 10 microns.

Figure 5:
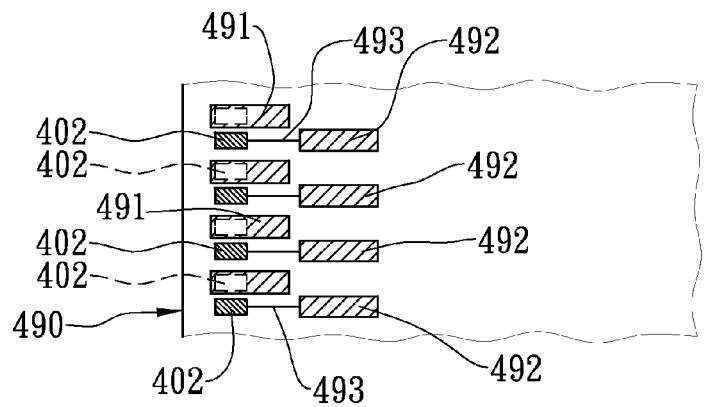
FIGS. 5-5A illustrate top and cross-sectional views of an alternative semiconductor chip according to the invention.
Figure 5A:
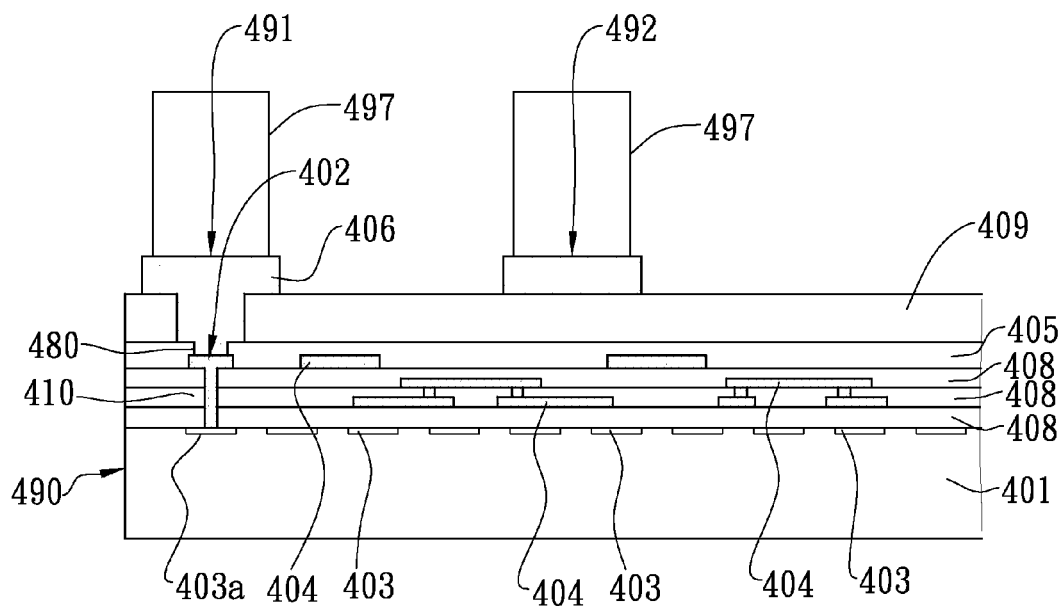

FIGS. 5 and 5A are an embodiment of the invention to show top and cross-sectional views of a semiconductor chip. The contact pads 402 are placed close to the edge 490 of the semiconductor chip 400. A patterned metal layer 406 including multiple contact pads 491 and 492 and traces 493 is formed on the polymer layer 409 and on the contact pads 402 exposed by openings in the passivation layer 405. The contact pads 491 aligned in the external line are placed on the contact pads 402 exposed by the openings in the passivation layer 405, while the contact pads 492 aligned in the internal line are placed not on the contact pads 402 exposed by the openings in the passivation layer 405 but on the polymer layer 409. The traces 493 of the patterned metal layer connect the contact pads 402 exposed by the openings in the passivation layer 405 to the contact pads 492 aligned in the internal line. Various metal bumps described in the above paragraphs can be formed on the contact pads 491 and 492. Optionally, the patterned metal layer 406 can be formed on the passivation layer 405 without the polymer layer 409 between the patterned metal layer 406 and the passivation layer 405.

Figure 6:
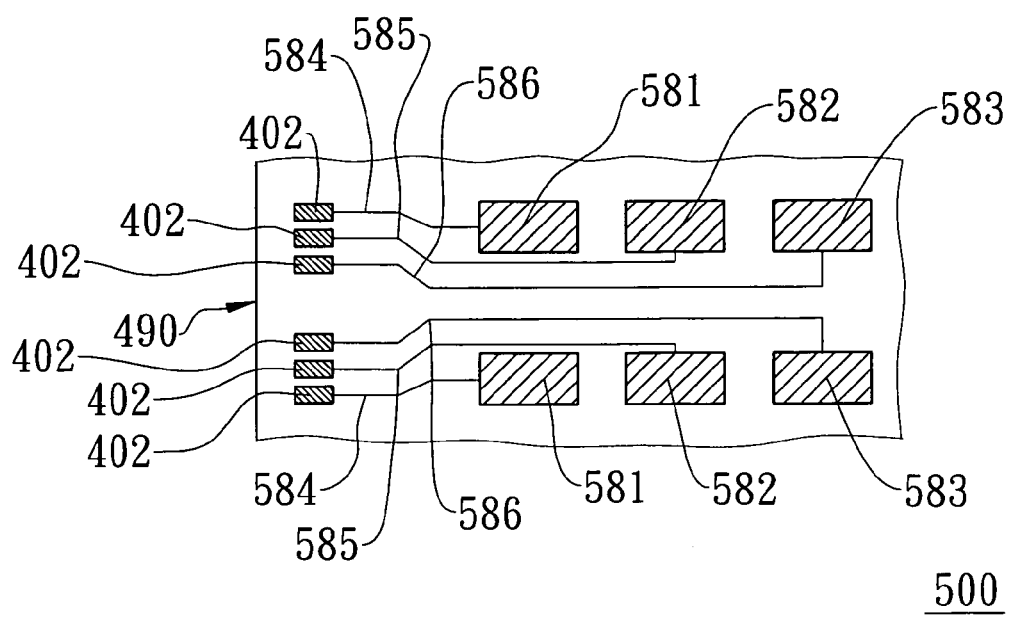
FIG. 6 illustrates a top view of an alternative semiconductor chip according to the invention.

FIG. 6 is an embodiment of the invention to show a top view of a semiconductor chip. The patterned metal layer formed over the passivation layer and on the contact pads exposed by the openings in the passivation layer includes multiple contact pads 581, 582 and 583 and traces 584, 585 and 586. The contact pads 581, 582 and 583 used to have metal bumps formed thereon can be aligned in three lines along an edge 490 of the semiconductor chip 500. Multiple traces 586 of the patterned metal layer connecting the contact pads 402 exposed by the openings in the passivation layer to the contact pads 583 aligned in the internal line pass through the gap between the neighboring contact pads 581 aligned in the external line and the gap between the neighboring contact pads 582 aligned in the middle line. Multiple traces 585 of the patterned metal layer connecting the contact pads 402 exposed by the openings in the passivation layer to the contact pads 582 aligned in the middle line pass through the gap between the neighboring contact pads 581 aligned in the external line. The patterned metal layer can be formed on the passivation layer without the polymer layer between the patterned metal layer and the passivation layer. Alternatively, the patterned metal layer can be formed on the polymer layer deposited on the passivation layer.

Preferably, the material of the metal bumps is soft and ductile to buffer and absorb the shock energy during assembling the semiconductor chip and an external circuitry or to buffer and absorb the shock energy during a probe or testing card is poked in the metal bumps. In accordance with the invention, the thicker the metal bumps are, the more energy the metal bumps absorb. The invention allows the semiconductor devices under the metal bumps without being damaged if a shock happens to the metal bumps.

The RDL layer is employed to change the I/O layout from the fine-pitched contact pads exposed by the opening in the passivation layer to the coarse-pitched contact pads formed over the fine-pitched contact pads or the passivation layer. Therefore, the process for forming metal bumps is easily performed.

In this invention, the peripheral region of the semiconductor substrate close to the edge thereof may have semiconductor devices formed therein or on. The rate of the semiconductor devices occupying the top surface of the semiconductor substrate is improved and therefore the semiconductor chip can be shrunk.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

One skilled in the art will understand that the embodiment of the present invention as shown in the drawings and described above is exemplary only and not intended to be limiting.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A semiconductor chip comprising:
   a silicon substrate;
   a MOS device in or on said silicon substrate;
   a first metal layer over said silicon substrate;
   a dielectric layer on said first metal layer and over said silicon substrate;
   a second metal layer on said dielectric layer;
   a passivation layer on said second metal layer and over said dielectric layer, wherein a first opening in said passivation layer is over a first contact pad of said second metal layer, a second opening in said passivation layer is over a second contact pad of said second metal layer, and a third opening in said passivation layer is over a third contact pad of said second metal layer, wherein said first, second and third contact pads are aligned in a first line, wherein said second contact pad is between said first and third contact pads, and wherein said passivation layer comprises a nitride layer;
   a patterned metal layer on said first, second and third contact pads and over said passivation layer, wherein said patterned metal layer comprises a fourth contact pad on said first contact pad, wherein said fourth contact pad is connected to said first contact pad through said first opening, wherein said patterned metal layer comprises a fifth contact pad connected to said second contact pad through said second opening, wherein the position of said fifth contact pad from a top perspective view is different from that of said second contact pad, and wherein said patterned metal layer comprises a sixth contact pad on said third contact pad, wherein said sixth contact pad is connected to said third contact pad through said third opening;
   a first metal bump on said fourth contact pad and over said first contact pad;
   a second metal bump on said fifth contact pad, wherein the position of said second metal bump from said top perspective view is different from that of said second contact pad; and
   a third metal bump on said sixth contact pad and over said third contact pad, wherein said first and third metal bumps are aligned in a second line parallel with said first line, and wherein said third metal bump comprises a gold layer, having more than 50 percent by weight of gold and having a height between 8 and 50 micrometers, over said third and sixth contact pads.

2. The semiconductor chip of claim 1 further comprising a polymer layer between said patterned metal layer and said passivation layer.

3. The semiconductor chip of claim 2, wherein said polymer layer comprises polyimide.

4. The semiconductor chip of claim 2, wherein said polymer layer comprises benzocyclobutene (BCB).

5. The semiconductor chip of claim 2, wherein said polymer layer has a thickness between 1 and 30 micrometers.

6. The semiconductor chip of claim 1, wherein said nitride layer has a thickness between 0.2 and 1 micrometer.

7. The semiconductor chip of claim 1, wherein said gold layer has more than 90 percent by weight of gold.

8. The semiconductor chip of claim 1, wherein said height is between 10 and 30 micrometers.

9. The semiconductor chip of claim 1, wherein said first and second metal layers comprise aluminum.

10. The semiconductor chip of claim 1, wherein said first and second metal layers comprise electroplated copper.

11. A chip comprising:
a silicon substrate;
a MOS device in or on said silicon substrate;
a first metal layer over said silicon substrate;
a dielectric layer on said first metal layer and over said silicon substrate;
a second metal layer on said dielectric layer;
a passivation layer on said second metal layer and over said dielectric layer, wherein a first opening in said passivation layer is over a first contact pad of said second metal layer, a second opening in said passivation layer is over a second contact pad of said second metal layer, and a third opening in said passivation layer is over a third contact pad of said second metal layer, wherein said first, second and third contact pads are aligned in a first line, wherein said second contact pad is between said first and third contact pads, and wherein said passivation layer comprises a nitride layer;
a patterned metal layer on said first, second and third contact pads and over said passivation layer, wherein said patterned metal layer comprises a first metal trace over said passivation layer, wherein said first metal trace is connected to said first contact pad through said first opening, and wherein said patterned metal layer comprises a fourth contact pad connected to said first contact pad through said first metal trace, wherein the position of said fourth contact pad from a top perspective view is different from that of said first contact pad, wherein said patterned metal layer comprises a second metal trace over said passivation layer, wherein said second metal trace is connected to said second contact pad through said second opening, and wherein said patterned metal layer comprises a fifth contact pad connected to said second contact pad through said second metal trace, wherein the position of said fifth contact pad from said top perspective view is different from that of said second contact pad, and wherein said patterned metal layer comprises a third metal trace over said passivation layer, wherein said third metal trace is connected to said third contact pad through said third opening, and wherein said patterned metal layer comprises a sixth contact pad connected to said third contact pad through said third metal trace, wherein the position of said sixth contact pad from said top perspective view is different from that of said third contact pad, wherein said second metal trace passes through a gap between said fourth and sixth contact pads;
a first metal bump on said fourth contact pad, wherein the position of said first metal bump from said top perspective view is different from that of said first contact pad;
a second metal bump on said fifth contact pad, wherein the position of said second metal bump from said top perspective view is different from that of said second contact pad; and
a third metal bump on said sixth contact pad, wherein said first and third metal bumps are aligned in a second line parallel with said first line, wherein the position of said third metal bump from said top perspective view is different from that of said third contact pad, and wherein said third metal bump comprises a gold layer, having more than 50 percent by weight of gold and having a height between 8 and 50 micrometers, over said sixth contact pad.

12. The chip of claim 11, wherein said gold layer has more than 90 percent by weight of gold.

13. The chip of claim 11 further comprising a polymer layer between said patterned metal layer and said passivation layer.

14. The chip of claim 13, wherein said polymer layer has a thickness between 1 and 30 micrometers.

15. The chip of claim 13, wherein said polymer layer comprises benzocyclobutene (BCB).

16. The chip of claim 13, wherein said polymer layer comprises polyimide.

17. The chip of claim 11, wherein said height is between 10 and 30 micrometers.

18. The chip of claim 11, wherein said first and second metal layers comprise electroplated copper.

19. The chip of claim 11, wherein said first and second metal layers comprise aluminum.

20. The chip of claim 11, wherein said passivation layer further comprises an oxide layer under said nitride layer.

* * * * *